(12) United States Patent
Bast et al.

(10) Patent No.: US 6,936,299 B2
(45) Date of Patent: Aug. 30, 2005

(54) METHOD AND DEVICE FOR IN SITU LAYER THICKNESS DETERMINATION

(75) Inventors: Ulrich Bast, Munich (DE); Roman Beyer, Berlin (DE); Ralph Reiche, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 40 days.

(21) Appl. No.: 10/434,165

(22) Filed: May 9, 2003

(65) Prior Publication Data

US 2003/0230138 A1 Dec. 18, 2003

(30) Foreign Application Priority Data

May 10, 2002 (EP) .............................................. 02010628

(51) Int. Cl.⁷ .............................. B05D 7/22; B23C 16/00
(52) U.S. Cl. .......................... 427/10; 427/250; 427/237; 427/248.1
(58) Field of Search ......................... 427/10, 250, 237, 427/248.1

(56) References Cited

U.S. PATENT DOCUMENTS

| | | | | |
|---|---|---|---|---|
| 4,898,746 A | * | 2/1990 | Opresko ....................... | 427/10 |
| 5,057,781 A | * | 10/1991 | Atkins et al. ................ | 324/635 |
| 5,142,228 A | * | 8/1992 | Kingsbury ................... | 324/230 |
| 5,466,638 A | * | 11/1995 | Eguchi ........................ | 438/625 |
| 6,436,246 B1 | * | 8/2002 | Sandhu ................... | 204/192.13 |

FOREIGN PATENT DOCUMENTS

JP            05215290 A  *  8/1993  ........... F16L/59/02

\* cited by examiner

*Primary Examiner*—Timothy Meeks
*Assistant Examiner*—Eric B. Fuller
(74) *Attorney, Agent, or Firm*—Harness, Dickey & Pierce, P.L.C.

(57) ABSTRACT

A method and device for layer thickness determination allows for the layer thickness to be determined in situ during the coating process. This is achieved using a sensor which has an electrical property which, as a result of the coating process, changes in a manner which is representative of the layer thickness which has been reached. As such, this property can be measured.

7 Claims, 1 Drawing Sheet

METHOD AND DEVICE FOR IN SITU LAYER THICKNESS DETERMINATION

The present application hereby claims priority under 35 U.S.C. §119 on European patent application number EP 02010628.2 filed May 10 2002, the entire contents of which are hereby incorporated herein by reference.

FIELD OF THE INVENTION

The invention generally relates to a method and/or device for layer thickness determination.

BACKGROUND OF THE INVENTION

In coating processes, such as for example internal alitizing processes (aluminizing of internal surfaces), the layer thickness is determined by way of a metallographic examination. For this purpose, a wire specimen is introduced into the coating process at a location which is representative of a component which is to be coated. After the coating process has ended, the wire specimen is removed and is then, expensively, cut open and examined. Each coating process is monitored and documented by the use of concomitant working specimens. These measuring and testing methods do not allow coating processes which are not to spec to be corrected as they are ongoing. Therefore, this is a very expensive form of quality assurance.

SUMMARY OF THE INVENTION

It is an object of an embodiment of the invention to provide a method and device for layer thickness determination which solves at least one of the problems outlined above.

An object may be achieved by a method or device in which a sensor is exposed to the coating process in the same way as the component which is to be treated, and an electrical property of this sensor is measured. This property changes as a result of the coating process, so that in situ layer thickness determination during the coating process is possible.

The method is suitable in particular for alitizing processes in which aluminum is introduced into a component (refurbishment).

The electrical resistance is preferably used as a simple electrical measurement variable which is representative of the coating result.

The sensor is, for example, a sintered body, since a sintered body can take up the applied coating material in a representative way (accumulation and diffusion rate). Alternatively, it may be, for example, also porous or, for example, made from the material of the component which is to be coated or from MCrAlY.

The method and/or device is particularly suitable for coating processes in the interior of a component, since these are not readily accessible.

BRIEF DESCRIPTION OF THE DRAWINGS

An exemplary embodiment of the invention is illustrated in simplified form in the drawings, in which.

DETAILED DESCRIPTION OF THE PREFERRED EMBODIMENTS

Figure 1:
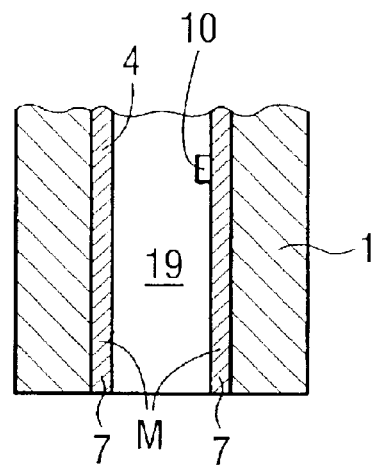
FIG. 1 shows a component with a sensor, which component is coated, with the method according to an embodiment of the invention being used for layer thickness determination.

FIG. 1 shows a hollow component 1 which is to be coated, for example, on an inner surface 4. However, the method can also be used for the in situ layer thickness determination of external surfaces.

A layer 7 of the material M is applied to the inner surface 4 by means of known processes, such as for example CVD (chemical vapor deposition) processes, electrochemical processes or other known coating processes. A sensor 10 is arranged in the cavity 19 of the component 1 and is therefore coated in the same way as the component 1 which is to be treated.

Figure 2:
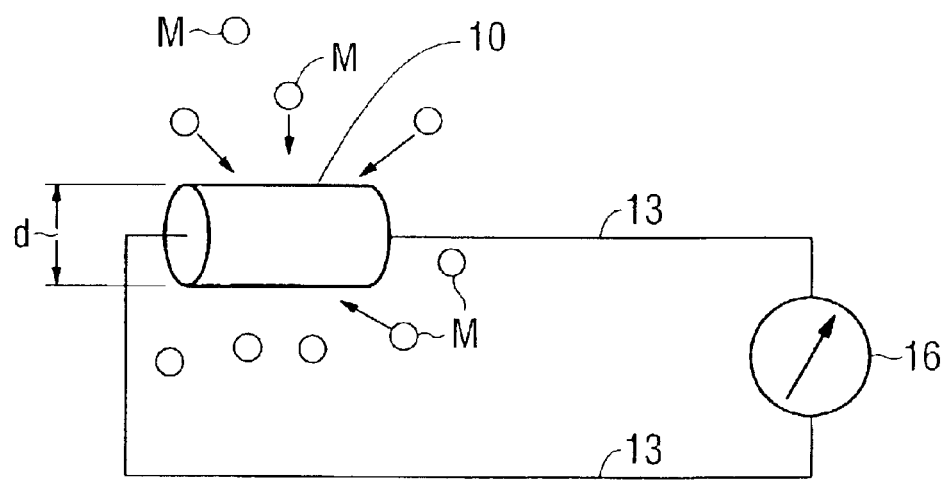
FIG. 2 shows a measuring arrangement having a sensor for the method according to an embodiment of the invention.

FIG. 2 shows an enlarged view of the sensor 10.

The sensor 10 consists of a material which has an electrical property, such as for example its electrical resistance, impedance, capacitance or the like, which changes as a result of some form of interaction with the material M which forms the layer. The sensor 10 may be of any desired shape, i.e. may, for example, be a piece of wire or in the shape of a small plate.

The sensor 10 is connected to an electrical measuring unit 16 via electrical lines 13; the measuring unit measures the electrical parameter which changes as a result of the sensor 10 being coated with the material M. The way in which the layer thickness is dependent on the electrical variable is known from calibration curves determined in preliminary tests.

The method is used in particular for internal alitizing processes in which aluminum is applied to an inner surface 4 of a component 1 (M=Al). In this case, the sensor consists, for example, of the material MCrAlY (M=Fe, Co, Ni) and changes with the aluminum applied during a CVD process in such a manner that the measured electrical characteristic variable changes in a manner which is representative of the coating result.

List of Reference Symbols
1 Component
4 Inner surface
7 Layer
10 Sensor
13 Electrical line
16 Electrical evaluation/control
19 Cavity The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for in situ layer thickness determination during a coating process of a component, comprising:
   coating the component and a sensor, wherein the sensor is changed by the coating process such that an electrical property of the sensor, which bears a correlation to the layer thickness, is influenced, and wherein the sensor consists of MCrAlY, where M is an element selected from the group consisting of iron, cobalt and nickel; and
   using the change in the electrical property to determine the layer thickness.

2. A method for in situ layer thickness determination during a coating process of a component, comprising:
   coating the component and a sensor, wherein the sensor is changed by the coating process, such that an electrical property of the sensor, which bears a correlation to the layer thickness, is influenced, and wherein the sensor is a sintered part; and using the change in the electrical property to determine the layer thickness.

3. The method as claimed in claim 2, wherein the coating process is an alitizing process.

4. The method as claimed in claim 2, wherein the electrical property is the electrical resistance.

5. The method as claimed in claim 2, wherein the coating process is a chemical vapor deposition process.

6. The method as claimed in claim 2, wherein the coating process is used for the internal coating of a component.

7. A method for in situ layer thickness determination during a coating process of a component, comprising:

changing a sensor by a coating process in such a way that, as a result, an electrical property of the sensor, which bears a correlation to the layer thickness, is influenced; and using the change in the electrical property to determine the layer thickness, wherein the sensor consists of MCrAlY, where M is an element selected from the group of iron, cobalt and nickel.

* * * * *